United States Patent
Shin et al.

(10) Patent No.: US 11,527,996 B2
(45) Date of Patent: Dec. 13, 2022

(54) FREQUENCY MIXING DEVICE

(71) Applicant: ELECTRONICS AND TELECOMMUNICATIONS RESEARCH INSTITUTE, Daejeon (KR)

(72) Inventors: Dong Hwan Shin, Daejeon (KR); Dong Pil Chang, Daejeon (KR); Byoung Hak Kim, Daejeon (KR); Seong Mo Moon, Daejeon (KR); In Bok Yom, Daejeon (KR); Jun Han Lim, Daejeon (KR); Jin Cheol Jeong, Daejeon (KR); In Kwon Ju, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/496,984

(22) Filed: Oct. 8, 2021

(65) Prior Publication Data
US 2022/0115986 A1    Apr. 14, 2022

(30) Foreign Application Priority Data
Oct. 12, 2020    (KR) .................. 10-2020-0131357

(51) Int. Cl.
*H03D 7/12* (2006.01)
*H03K 5/00* (2006.01)

(52) U.S. Cl.
CPC ......... *H03D 7/125* (2013.01); *H03K 5/00006* (2013.01)

(58) Field of Classification Search
CPC .......... H03D 7/125; H03D 2200/0043; H03D 7/1441; H03D 7/1491; H03D 2200/0074; H03K 5/00006; H03H 7/12
See application file for complete search history.

(56) References Cited

U.S. PATENT DOCUMENTS 5,448,197 A * 9/1995 Sagawa .................. H03D 7/125
455/333
5,450,227 A * 9/1995 Higgins ................. H03D 7/125
331/172

(Continued)

FOREIGN PATENT DOCUMENTS

JP          2011-199725 A    10/2011
KR    10-2005-0057833 A     6/2005
(Continued)

*Primary Examiner* — John W Poos
(74) *Attorney, Agent, or Firm* — LRK Patent Law Firm

(57) ABSTRACT

Provided is a FET resistive frequency mixing device having improved RF-LO and IF-LO isolations. The frequency mixing device includes: a field effect transistor (FET), a local oscillation matching circuit connected to a gate of the FET to transfer a local oscillation signal to the gate of the FET, a gate biasing circuit connected to the gate of the FET, a radio frequency (RF) matching circuit having a first terminal connected to a drain side of the FET and a second terminal serving as a RF terminal to receive or output a RF signal, an intermediate frequency (IF) matching circuit having a first terminal connected to the drain side of the FET and a second terminal serving as an IF terminal to receive or output an IF signal, and a series resonance circuit providing a path from the drain of the FET to ground for the local oscillation signal.

10 Claims, 7 Drawing Sheets

(56) References Cited

U.S. PATENT DOCUMENTS

| | | | |
|---|---|---|---|
| 8,183,896 B2 * | 5/2012 | Jung | ................... H03D 7/125 455/333 |
| 2007/0096842 A1 | 5/2007 | Hyun et al. | |
| 2019/0123778 A1 | 4/2019 | Jeong et al. | |

FOREIGN PATENT DOCUMENTS

| | | |
|---|---|---|
| KR | 10-0956585 B1 | 5/2010 |
| KR | 10-1517852 B1 | 5/2015 |
| KR | 10-2016-0113851 A | 10/2016 |
| KR | 10-2020-0003099 A | 1/2020 |
| KR | 10-2020-0071485 A | 6/2020 |
| WO | WO-2019167619 A1 * | 9/2019 ............. H03D 7/125 |

* cited by examiner

FREQUENCY MIXING DEVICE

CROSS-REFERENCE TO RELATED APPLICATION

The present application claims a convention priority based on Korean Patent Application No. 10-2020-0131357 filed on Oct. 12, 2020, with the Korean Intellectual Property Office (KIPO), the entire content of which is incorporated herein by reference.

BACKGROUND

1. Technical Field

The present disclosure relates to a frequency mixing device and, more particularly, to an FET resistive frequency mixer.

2. Description of Related Art

A frequency mixer, which is an essential device in a wireless communications system, may convert an intermediate frequency (IF) signal into a radio frequency (RF) signal or vice versa. Types of conventional frequency mixers may include a passive frequency mixer employing a diode, an active frequency mixer employing a field effect transistor (FET), and a FET resistive frequency mixer.

The FET resistive frequency mixer performs a frequency mixing by using a linear transconductance region in an I-V characteristic curve the FET to which no drain bias is applied, and thus reveals characteristics of inherently high linearity and low DC power consumption. When a local oscillation (LO) signal is applied to a gate of the FET in the FET resistive frequency mixer to turn on and off the FET, a frequency of an IF signal or RF signal applied to a drain of the FET is mixed with the frequency of the LO signal due to a time-varying resistance of the FET. A frequency mixer having a high linearity is preferable since such a frequency mixer allows use of an input signal of higher power.

FIG. 1 shows a typical FET resistive frequency mixer. In the FET resistive frequency mixer of FIG. 1, a local oscillation signal is applied to a gate of a field effect transistor (FET) 110 through an LO matching circuit 120. The gate of the FET 110 is biased by a gate biasing circuit 130. A drain of the FET 110 is not biased and connected to ground via a radio frequency choke (RFC) so as to maintain an unbiased state. An RF input/output terminal and an IF input/output terminal are connected to the drain of the FET 110 through a RF matching circuit 150 and an IF matching circuit 160, respectively. In case of a frequency upconversion, an IF input signal is applied through the IF matching circuit 160 and mixed with the LO signal at the drain of the FET 110, and an RF output signal is output through the RF matching circuit 150. In case of a frequency downconversion, an RF input signal is applied through the RF matching circuit 150 and mixed with the LO signal at the drain of the FET 110, and an IF output signal is output through the IF matching circuit 160.

However, in such a FET resistive frequency mixer, an LO signal component much larger than the RF signal may appear at the RF output terminal. Thus, it is necessary to remove the LO signal component by the RF matching circuit. This figure of merit to cancel the LO signal component is referred to as a RF-LO isolation. In order to improve the RF-LO isolation by the RF matching circuit, a larger and more complex RF matching circuit may be required. For this reason, it is difficult to implement a small and lightweight frequency mixer. In particular, the difficulty in improving the isolation becomes greater in case of an integrated circuit (IC) chip type product such as a frequency mixer monolithic microwave integrated circuit (MMIC).

SUMMARY

Provided is a FET resistive frequency mixing device having improved RF-LO and IF-LO isolations by using a small-sized band-stop filter.

According to an aspect of an exemplary embodiment, a frequency mixing device includes: a field effect transistor (FET) having a gate, a drain, and a source, a local oscillation matching circuit connected to the gate of the FET to transfer a local oscillation signal to the gate of the FET, a gate biasing circuit connected to the gate of the FET to bias the gate of the FET, a radio frequency (RF) matching circuit having a first terminal connected to a drain side of the FET and a second terminal serving as a RF terminal to receive or output a RF signal, an intermediate frequency (IF) matching circuit having a first terminal connected to the drain side of the FET and a second terminal serving as an IF terminal to receive or output an IF signal, and a series resonance circuit providing a path from the drain of the FET to ground for the local oscillation signal.

The series resonance circuit may include a capacitor and an inductor connected in series.

The frequency mixing device may further include a band-stop filter having a first terminal connected to the drain of the FET and a second terminal connected to the RF matching circuit or the IF matching circuit to reduce the local oscillation signal transferred to the second terminal of the band-stop filter.

The band-stop filter may block or reflect at least some portion of the local oscillation signal received by the band-stop filter.

The band-stop filter may be disposed between the drain of the FET and the first terminal of the RF matching circuit or between the drain of the FET and the first terminal of the IF matching circuit.

The band-stop filter may be formed in a spiral shape using a spurline.

The RF matching circuit may include a high-pass filter or a band-pass filter configured to deliver a RF output signal having a frequency in which a frequency of the IF signal and a frequency of the local oscillation signal are mixed.

The IF matching circuit may include a low-pass filter or a band-pass filter configured to deliver an IF output signal having a frequency in which a frequency of the RF signal and a frequency of the local oscillation signal are mixed.

The frequency mixing device may further include a drain grounding circuit connected to the second terminal of the band-stop filter to provide a path from the second terminal of the band-stop filter to ground.

The drain grounding circuit may include a radio frequency choke (RFC).

The RF matching circuit or the IF matching circuit may include a grounding path configured to selectively connect the drain side of the FET to ground.

According to an exemplary embodiment of the present disclosure, the RF-LO isolation and the IF-LO isolation of the FET resistive frequency mixing device may be improved by using a small-sized band-stop filter. In particular, it is possible to enhance the RF-LO isolation and the IF-LO isolation without using any complex circuit disposed internally or externally. The FET resistive frequency mixing device employing the small-sized band-stop filter according to an exemplary embodiment of the present disclosure may be applicable to a hybrid microwave integrated circuit (HMIC) device as well as a monolithic microwave integrated circuit (MMIC) device.

BRIEF DESCRIPTION OF THE DRAWINGS

In order that the disclosure may be well understood, there will now be described various forms thereof, given by way of example, reference being made to the accompanying drawings, in which.

Figure 1:
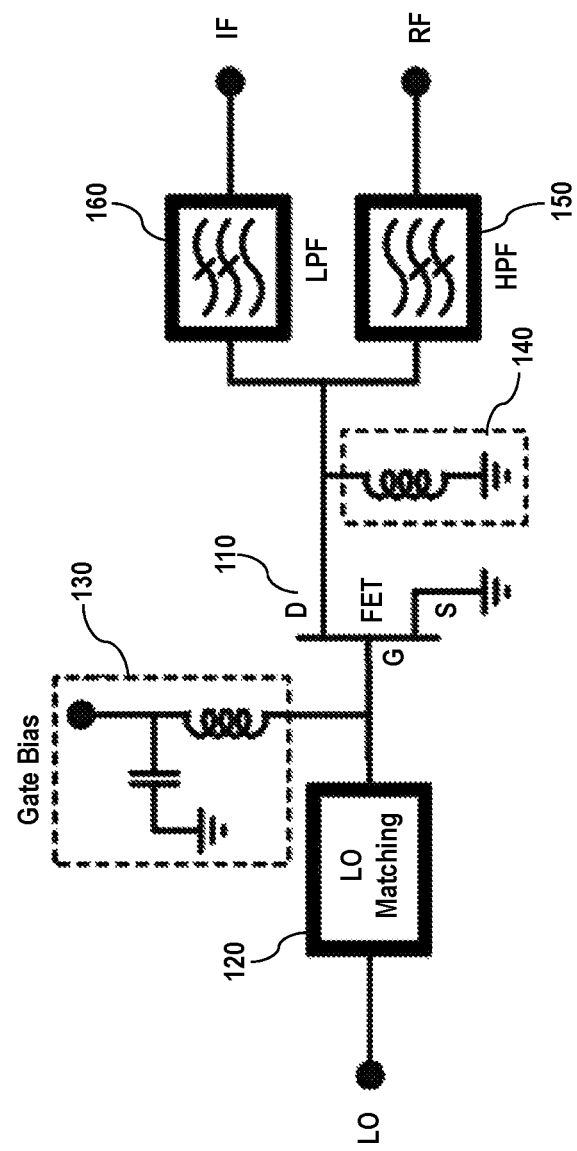
FIG. 1 is a circuit diagram of a typical FET resistive frequency mixer.

The drawings described herein are for illustration purposes only and are not intended to limit the scope of the present disclosure in any way.

DETAILED DESCRIPTION

For a more clear understanding of the features and advantages of the present disclosure, exemplary embodiments of the present disclosure will be described in detail with reference to the accompanied drawings. However, it should be understood that the present disclosure is not limited to particular embodiments disclosed herein but includes all modifications, equivalents, and alternatives falling within the spirit and scope of the present disclosure. In the drawings, similar or corresponding components may be designated by the same or similar reference numerals.

The terminologies including ordinals such as "first" and "second" designated for explaining various components in this specification are used to discriminate a component from the other ones but are not intended to be limiting to a specific component. For example, a second component may be referred to as a first component and, similarly, a first component may also be referred to as a second component without departing from the scope of the present disclosure. As used herein, the term "and/or" may include a presence of one or more of the associated listed items and any and all combinations of the listed items.

When a component is referred to as being "connected" or "coupled" to another component, the component may be directly connected or coupled logically or physically to the other component or indirectly through an object therebetween. Contrarily, when a component is referred to as being "directly connected" or "directly coupled" to another component, it is to be understood that there is no intervening object between the components. Other words used to describe the relationship between elements should be interpreted in a similar fashion.

The terminologies are used herein for the purpose of describing particular exemplary embodiments only and are not intended to limit the present disclosure. The singular forms include plural referents as well unless the context clearly dictates otherwise. Also, the expressions "comprises," "includes," "constructed," "configured" are used to refer a presence of a combination of stated features, numbers, processing steps, operations, elements, or components, but are not intended to preclude a presence or addition of another feature, number, processing step, operation, element, or component.

Unless defined otherwise, all terms used herein, including technical or scientific terms, have the same meaning as commonly understood by those of ordinary skill in the art to which the present disclosure pertains. Terms such as those defined in a commonly used dictionary should be interpreted as having meanings consistent with their meanings in the context of related literatures and will not be interpreted as having ideal or excessively formal meanings unless explicitly defined in the present application.

Exemplary embodiments of the present disclosure will now be described in detail with reference to the accompanying drawings.

Figure 2:
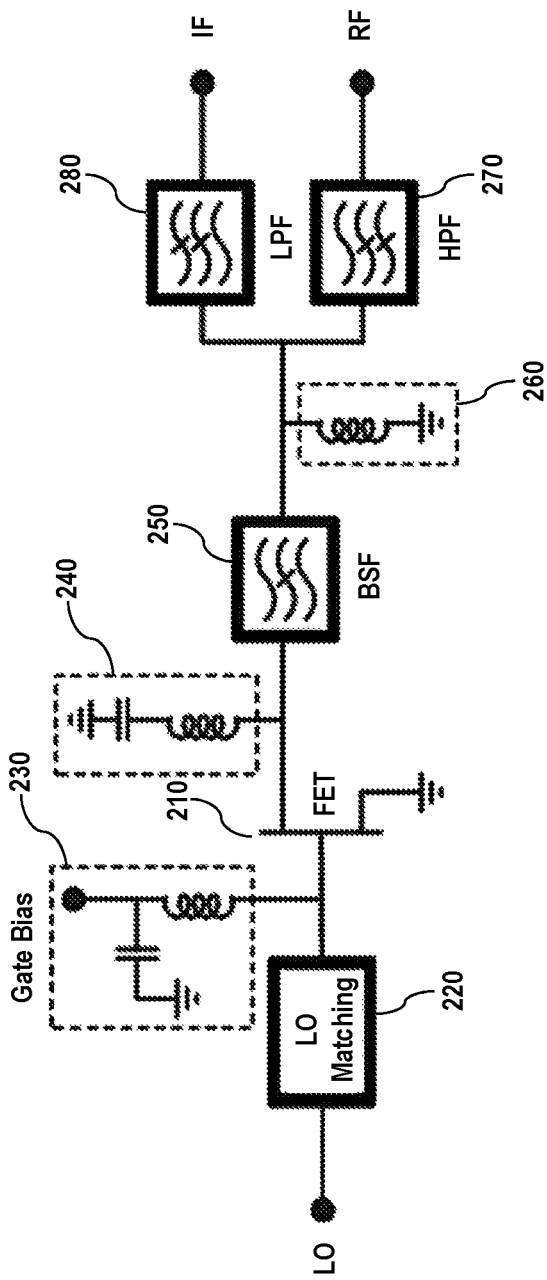
FIG. 2 is a circuit diagram of a FET resistive frequency mixer according to an exemplary embodiment of the present disclosure.

FIG. 2 is a circuit diagram of a FET resistive frequency mixer according to an exemplary embodiment of the present disclosure. The FET resistive frequency mixer according to an embodiment of the present disclosure may include a field effect transistor 210 having a source (S), a gate (G), and a drain (D), an local oscillation (LO) matching circuit 220, a gate biasing circuit 230, a series resonance circuit 240, and a band-stop filter (BSF) 250, a drain grounding circuit 260, a radio frequency (RF) matching circuit 270, and an intermediate frequency (IF) matching circuit 280.

The LO matching circuit 220 may be connected to the gate of the FET 210 and transfer a local oscillation signal to the gate of the FET 210. The gate bias circuit 230 may be connected to the gate of the FET 210 to bias the gate of the FET 210.

The gate of the FET 210 is connected to LO matching circuit 220 to receive the local oscillation signal. The drain of the FET 210 may be connected to an RF terminal through the RF matching circuit 270 and the band-stop filter 250. In addition, the drain of the FET 210 may be connected to an IF terminal through the IF matching circuit 280 and the band-stop filter 250. In the case of a frequency upconversion, the FET 210 may mix the local oscillation signal to an IF input signal received through the IF terminal and the IF matching circuit 280 to output an RF output signal resulting from a frequency mixing through the RF matching circuit 270 and the RF terminal. In the case of a frequency downconversion, the FET 210 may mix the local oscillation signal to an RF input signal received through the RF terminal and the RF matching circuit 280 to output an IF output signal resulting from the frequency mixing through the IF matching circuit 280 and the IF terminal.

The series resonance circuit 240, which includes a capacitor and an inductor connected in series, may be connected to the drain of the FET 210. The series resonance circuit 240 resonates at a local oscillation frequency and provides a grounding path for the local oscillation signal. Thus, the series resonance circuit 240 allows a portion of the local oscillation signal passed from the gate of the FET 210 through a gate-drain capacitance of the FET 210 to flow to the ground. The band-stop filter 250, which has a first terminal connected to the drain of the FET 210, may block the local oscillation signal having passed the series resonance circuit 240 to enhance a RF-LO isolation and an IF-LO isolation.

The drain grounding circuit 260, which may include a radio frequency choke (RFC), may be connected to a second terminal of the band-stop filter 250 and provide a path from the second terminal of the band-stop filter 250 to ground so that the drain of the FET 210 remains unbiased. The drain grounding circuit 260 may be omitted in case that the RF matching circuit 270 or the IF matching circuit 280 has a grounding path similar to the drain grounding circuit 260.

The RF matching circuit 270 has a first terminal connected to the second terminal of the band-stop filter 250 and a second terminal for receiving or outputting an RF signal. The second terminal of the RF matching circuit 270 may be the RF terminal of the FET resistive frequency mixer. The RF matching circuit 270 may be implemented by a high-pass filter or a band-pass filter. The IF matching circuit 280 has a first terminal connected to the second terminal of the band-stop filter 250 and a second terminal for receiving or outputting an IF signal. The second terminal of the IF matching circuit 270 may be the IF terminal of the FET resistive frequency mixer. The IF matching circuit 280 may be implemented by a low-pass filter or the band-pass filter (BPF). In the case of the frequency upconversion, the IF terminal, i.e. the second terminal of the IF matching circuit 280, receives the IF input signal, and the RF terminal, i.e. the second terminal of the RF matching circuit 270 outputs the RF output signal resulting from the frequency mixing. In the case of the frequency downconversion, the RF terminal, i.e. the second terminal of the RF matching circuit 270, receives the RF input signal, and the IF terminal, i.e. the second terminal of the IF matching circuit 280 outputs the IF output signal resulting from the frequency mixing.

According to the frequency mixer described above, the series resonance circuit 240 may improve the LO isolation by removing a portion of the local oscillation signal, and the band-stop filter 250 may further enhance the RF-LO isolation and the IF-LO isolation by reflecting the local oscillation signal.

In an exemplary embodiment, a FET resistive frequency mixer converting a 7 GHz IF signal to a 30 GHz RF signal was designed, and various simulations were performed on the frequency mixer. The design and simulation results will now be described with reference to FIGS. 3 to 7.

Figure 3:
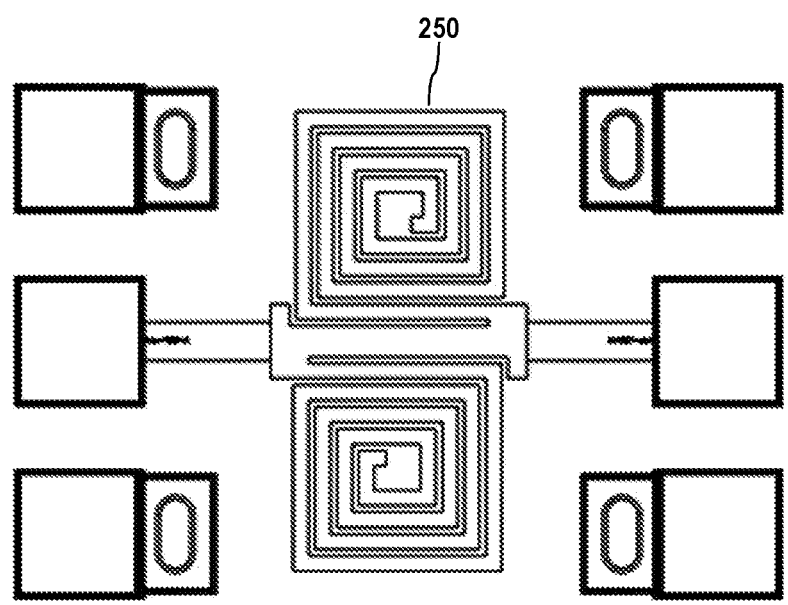
FIG. 3 illustrates a layout of a semiconductor microwave monolithic integrated circuit (MMIC) band-stop filter according to an exemplary embodiment of the present disclosure.

FIG. 3 shows a layout of a semiconductor microwave monolithic integrated circuit (MIMIC) band-stop filter according to an exemplary embodiment of the present disclosure.

It is desirable that the band-stop filter has a small size to enable to implement in a single-chip monolithic microwave integrated circuit (MMIC) and blocks 23 GHz local oscillation frequency signal at an output stage of the frequency mixer. In order to reduce the size, the band-stop filter 250 was formed in a spiral shape using a spurline having a length of $\lambda/4$. Here, $\lambda$ may denote a wavelength corresponding to a center frequency of the band-stop filter. In addition, the spurline structure of the band-stop filter 250 was disposed in duplicate, as shown in FIG. 3, to improve the isolation of the local oscillation signal. However, the form of shaping the band-stop filter 250 is not limited thereto.

Figure 4:
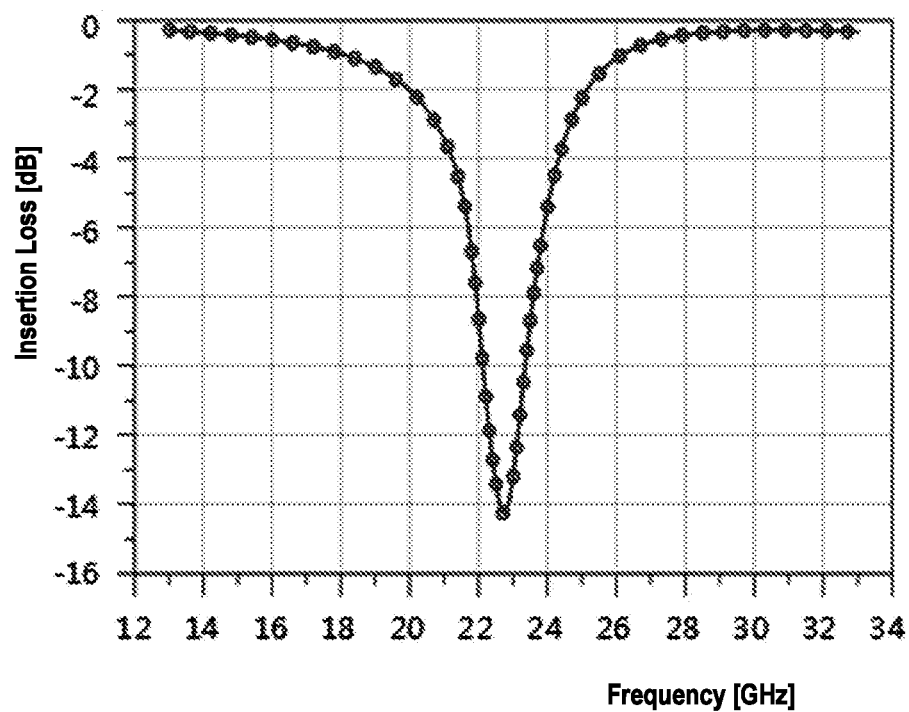
FIG. 4 is a graph illustrating an insertion loss simulation result of a band-stop filter shown in FIG. 2.

FIG. 4 is a graph showing an insertion loss simulation result of the band-stop filter 250. In FIG. 4, it can be seen that the band-stop filter reveals a band-stop performance of blocking the local oscillation signal by about 14 dB or greater at the local oscillation frequency of 23 GHz.

Figure 5:
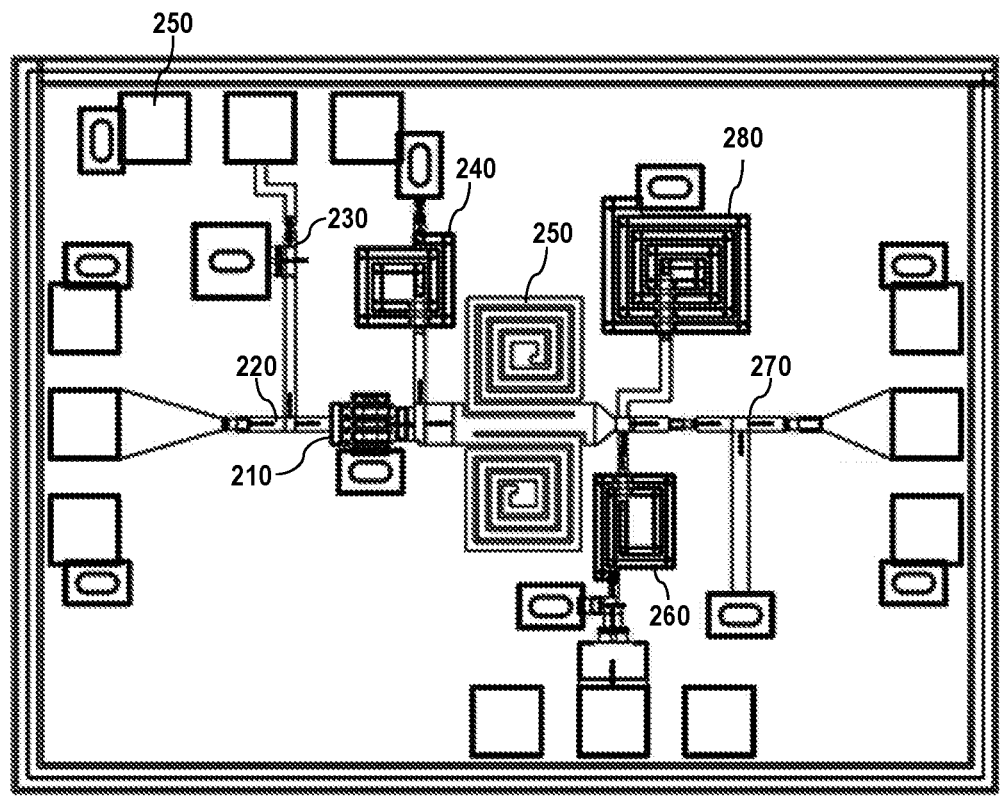
FIG. 5 is an exemplary layout of a semiconductor monolithic microwave integrated circuit (MMIC) for implementing the FET resistive frequency mixer according to an exemplary embodiment of the present disclosure.

FIG. 5 is an exemplary layout of the semiconductor MIMIC for implementing the FET resistive frequency mixer according to an exemplary embodiment of the present disclosure. The layout of the MMIC for implementing the FET resistive frequency mixer may include the FET 210 including the source, the gate, and the drain, the LO matching circuit 220, the gate biasing circuit 230, the series resonance circuit 240, the band-stop filter 250, the drain grounding circuit 260, the RF matching circuit 270, and the IF matching circuit 280. In particular, the series resonance circuit 240 and the band-stop filter 250 for enhancing the LO isolation may be disposed between the FET 210 and the matching circuits 270 and 280.

Figure 6:
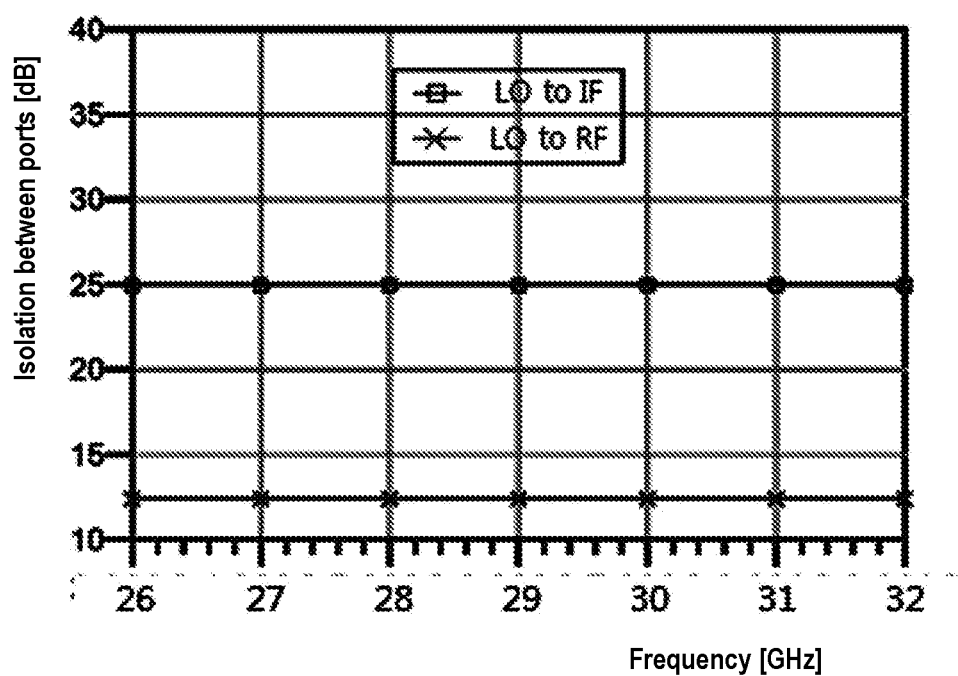
FIG. 6 is a graph showing a simulation result for an isolation performance of the FET resistive frequency mixer including a series resonance circuit but not including a band-stop filter.

FIG. 6 is a graph showing a simulation result for an isolation performance of the FET resistive frequency mixer including the series resonance circuit 240 but not including the band-stop filter 250. The FET resistive frequency mixer including only the series resonance circuit 240 revealed an RF-LO isolation of 12.5 dB and an IF-LO isolation of 25 dB. It is understood that the RF-LO isolation is lower than the IF-LO isolation by 12 dB or higher because the frequency difference between the RF signal and the LO signal is greater than the frequency difference between the IF signal and the LO signal.

Figure 7:
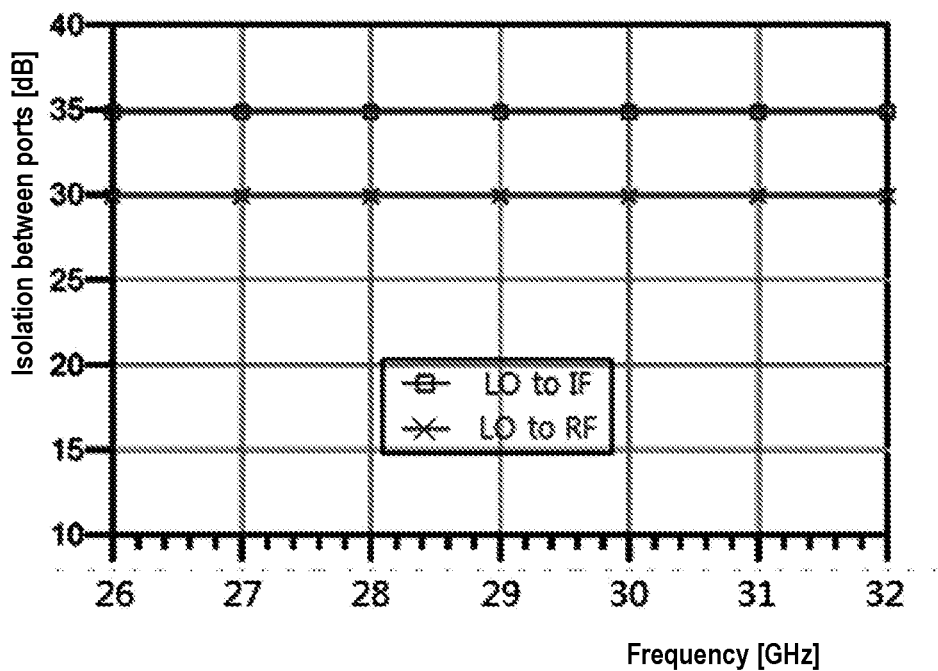
FIG. 7 is a graph showing a simulation result for the isolation performance of the FET resistive frequency mixer including both the series resonance circuit and the band-stop filter.

FIG. 7 is a graph showing a simulation result for the isolation performance of the FET resistive frequency mixer including both the series resonance circuit 240 and the band-stop filter 250. The FET resistive frequency mixer including both the series resonance circuit 240 and the band-stop filter 250 revealed the RF-LO isolation of 30 dB and the IF-LO isolation of 35 dB. It can be seen that the RF-LO isolation and the IF-LO isolation revealed improved performances by 17.5 dB and 10 dB than the mixer including only the series resonance circuit 240.

The device and method according to exemplary embodiments of the present disclosure can be implemented by computer-readable program codes or instructions stored on a computer-readable intangible recording medium. The computer-readable recording medium includes all types of recording device storing data which can be read by a computer system. The computer-readable recording medium may be distributed over computer systems connected through a network so that the computer-readable program or codes may be stored and executed in a distributed manner.

The computer-readable recording medium may include a hardware device specially configured to store and execute program instructions, such as a ROM, RAM, and flash memory. The program instructions may include not only machine language codes generated by a compiler, but also high-level language codes executable by a computer using an interpreter or the like.

Some aspects of the present disclosure described above in the context of the apparatus may indicate corresponding descriptions of the method according to the present disclosure, and the blocks or devices may correspond to operations of the method or features of the operations. Similarly, some aspects described in the context of the method may be expressed by features of blocks, items, or devices corresponding thereto. Some or all of the operations of the method may be performed by use of a hardware device such as a microprocessor, a programmable computer, or electronic circuits, for example. In some exemplary embodiments, one or more of the most important operations of the method may be performed by such a device.

In some exemplary embodiments, a programmable logic device such as a field-programmable gate array may be used to perform some or all of the functions of the methods described herein. The field-programmable gate array may be operated along with a microprocessor to perform one of the methods described herein. In general, the methods may be performed preferably by a certain hardware device.

While the present disclosure has been described above with respect to exemplary embodiments thereof, it will be apparent to those skilled in the art that various changes and modifications may be made without departing from the spirit and scope of the present disclosure defined in the following claims.

What is claimed is:

1. A frequency mixing device comprising:
    a field effect transistor (FET) having a gate, a drain, and a source;
    a local oscillation matching circuit connected to the gate of the FET to transfer a local oscillation signal to the gate of the FET;
    a gate biasing circuit connected to the gate of the FET to bias the gate of the FET;
    a radio frequency (RE) matching circuit having a first terminal connected to a drain side of the FET and a second terminal serving as a RE terminal to receive or output a RF signal;
    an intermediate frequency (IF) matching circuit having a first terminal connected to the drain side of the FET and a second terminal serving as an IF terminal to receive or output an IF signal;
    a series resonance circuit providing a path from the drain of the FET to ground for the local oscillation signal to allow a portion of the local oscillation signal passing the FET to flow to ground; and
    a band-stop filter having a first terminal connected to the drain of the FET and a second terminal connected to the RF matching circuit or the IF matching circuit to reduce the local oscillation signal transferred to the second terminal of the band-stop filter.

2. The frequency mixing device of claim 1, wherein the series resonance circuit comprises a capacitor and an inductor connected in series to each other.

3. The frequency mixing device of claim 1, wherein the band-stop filter blocks or reflects at least some portion of the local oscillation signal received by the band-stop filter.

4. The frequency mixing device of claim 1, wherein the band-stop filter is disposed between the drain of the FET and the first terminal of the RF matching circuit or between the drain of the FET and the first terminal of the IF matching circuit.

5. The frequency mixing device of claim 1, wherein the band-stop filter is formed in a spiral shape using a spurline.

6. The frequency mixing device of claim 1, wherein the RF matching circuit comprises a high-pass filter or a band-pass filter configured to deliver a RF output signal having a frequency in which a frequency of the IF signal and a frequency of the local oscillation signal are mixed.

7. The frequency mixing device of claim 1, wherein the IF matching circuit comprises a low-pass filter or a band-pass filter configured to deliver an IF output signal having a frequency in which a frequency of the RF signal and a frequency of the local oscillation signal are mixed.

8. The frequency mixing device of claim 1, further comprising:
    a drain grounding circuit connected to the second terminal of the band-stop filter to provide a path from the second terminal of the band-stop filter to ground.

9. The frequency mixing device of claim 8, wherein the drain grounding circuit comprises a radio frequency choke (RFC).

10. The frequency mixing device of claim 1, wherein the RF matching circuit or the IF matching circuit comprises a grounding path configured to selectively connect the drain side of the FET to ground.

* * * * *